United States Patent
Werkman et al.

(10) Patent No.: US 11,754,931 B2
(45) Date of Patent: Sep. 12, 2023

(54) METHOD FOR DETERMINING CORRECTIONS FOR LITHOGRAPHIC APPARATUS

(71) Applicant: ASML NETHERLANDS B.V., Veldhoven (NL)

(72) Inventors: Roy Werkman, Eindhoven (NL); David Frans Simon Deckers, Turnhout (BE); Simon Philip Spencer Hastings, San Jose, CA (US); Jeffrey Thomas Ziebarth, San Jose, CA (US); Samee Ur Rehman, Milpitas, CA (US); Davit Harutyunyan, San Jose, CA (US); Chenxi Lin, Newark, CA (US); Yana Cheng, San Jose, CA (US)

(73) Assignee: ASML NETHERLANDS B.V., Veldhoven (NL)

(*) Notice: Subject to any disclaimer, the term of this patent is extended or adjusted under 35 U.S.C. 154(b) by 149 days.

(21) Appl. No.: 17/603,870

(22) PCT Filed: Mar. 18, 2020

(86) PCT No.: PCT/EP2020/057401
§ 371 (c)(1),
(2) Date: Oct. 14, 2021

(87) PCT Pub. No.: WO2020/212057
PCT Pub. Date: Oct. 22, 2020

(65) Prior Publication Data
US 2022/0252988 A1     Aug. 11, 2022

Related U.S. Application Data

(60) Provisional application No. 62/865,415, filed on Jun. 24, 2019, provisional application No. 62/834,618, filed on Apr. 16, 2019.

(51) Int. Cl.
*G03F 1/36*      (2012.01)
*G03F 7/00*      (2006.01)

(52) U.S. Cl.
CPC .............. *G03F 7/705* (2013.01); *G03F 1/36* (2013.01); *G03F 7/70508* (2013.01); *G03F 7/70616* (2013.01)

(58) Field of Classification Search
CPC ........ G03F 7/705; G03F 1/36; G03F 7/70508; G03F 7/70616; G03F 7/70525
See application file for complete search history.

(56) References Cited

U.S. PATENT DOCUMENTS 6,952,253 B2    10/2005  Lof et al.
2015/0079700 A1* 3/2015  Ke .................. G03F 7/70508
                                                                       438/5

FOREIGN PATENT DOCUMENTS

WO    2017060080    4/2017
WO    2017067748    4/2017
(Continued)

OTHER PUBLICATIONS

International Search Report and Written Opinion issued in corresponding PCT Patent Application No. PCT/EP2020/057401, dated Jun. 26, 2020.
(Continued)

*Primary Examiner* — Nghia M Doan
(74) *Attorney, Agent, or Firm* — Pillsbury Winthrop Shaw Pittman, LLP

(57) ABSTRACT

A method for determining a correction for an apparatus used in a process of patterning substrates, the method including: obtaining a group structure associated with a processing history and/or similarity in fingerprint of to be processed substrates; obtaining metrology data associated with a plurality of groups within the group structure, wherein the metrology data is correlated between the groups; and deter-
(Continued)

mining the correction for a group out of the plurality of groups by applying a model to the metrology data, the model including at least a group-specific correction component and a common correction component.

20 Claims, 4 Drawing Sheets

(56) References Cited

FOREIGN PATENT DOCUMENTS

| | | |
|---|---|---|
| WO | 2017144343 | 8/2017 |
| WO | 2018072980 | 4/2018 |

OTHER PUBLICATIONS

Taiwanese Office Action issued in corresponding Taiwanese Patent Application No. 109112608, dated Jan. 13, 2021.
Lee, H. et al.: "Experimental verification of on-product overlay improvement by Intra-lot overlay control using metrology based grouping", Proc. of SPIE, vol. 10147 (Mar. 2017).
Ebersbach, P. et al.: "Context-based virtual metrology", Proc. of SPIE, vol. 10585 (Mar. 13, 2018).

\* cited by examiner

METHOD FOR DETERMINING CORRECTIONS FOR LITHOGRAPHIC APPARATUS

CROSS-REFERENCE TO RELATED APPLICATIONS

This application is the U.S. national phase entry of PCT Patent Application No. PCT/EP2020/057401 which was filed on Mar. 18, 2020, which claims the benefit of priority of U.S. Patent Application No. 62/834,618 which was filed on Apr. 16, 2019 and U.S. Patent Application No. 62/865,415 which was filed on Jun. 24, 2019 which are incorporated herein in their entireties by reference.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA), a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling a stability of the lithographic apparatus may be used to improve reproduction of the pattern at low $k_1$.

SUMMARY

Effectiveness of control of a lithographic apparatus may depend on characteristics of individual substrates. For example, a first substrate processed by a first processing tool prior to processing by the lithographic apparatus (or any other process step of the manufacturing process, herein referred to generically as a manufacturing process step) may benefit from (slightly) different control parameters than a second substrate processed by a second processing tool prior to processing by the lithographic apparatus.

It is desirable, for example, to control the manufacturing process of interest based on knowledge of the pre-processing data, as this allows the control loop to anticipate an expected post-processing result. However, this control typically involves knowledge of the relation between pre-processing information and post-processing information and how one or more control parameters of the process of interest affect the post-processing data. It may not always be known how one or more control settings of the process of interest affect post-processing data. For example, an applied dose setting within a lithographic process may have a predictable effect on a certain critical dimension associated with a feature obtained after performing the lithographic process, or it may not. More problematic can be poor performance of methods that predict post-processing data based on, often very large amounts of, pre-processing data. Often the pre-processing data comprises too many parameters to allow the construction of a reliable model linking pre-processing data to post-processing data.

Machine learning techniques may be utilized to recognize patterns of cause-and-effect between processing context observed impact on one or more characteristics (such as overlay, CD, edge placement error (EPE), etc.) of substrates being subject to a process. These patterns can then be used to predict and correct errors in processing subsequent substrates. Some examples of such systems are described in PCT patent application publication no. WO 2017/060080, which is incorporated herein in its entirety by reference. In a few cases the pre-processing data has a limited set of associated parameters. For example, when only an identification (ID) of an etch chamber is used as the pre-processing data associated with to-be-processed substrates, it may be straightforward to establish a relation between post-processing data (e.g., an overlay fingerprint) and a value of the parameter comprised within the pre-processing or context data; for example by decomposing the overlay fingerprint to determine the contribution of the particular etch chamber used. However, in more complicated manufacturing processes (e.g., multiple patterning processes), the total process to produce a single layer may comprise multiple exposure and etch steps, with each step being potentially performed on one of a number of processing stations (stages or chambers) on one of a number of apparatuses. As such, the number of potential combinations of process tools and processing stations that each substrate is subject to can increase to the point where such a fingerprint decomposition is not feasible due to the metrology effort involved.

It would be desirable to improve such manufacturing control processes.

In an aspect, there is provided a method for determining a correction for an apparatus used in a process of patterning substrates, the method comprising: obtaining a group structure associated with a processing history and/or similarity in fingerprint of to be processed substrates; obtaining metrology data associated with a plurality of groups within the group structure, wherein the metrology data is correlated between the groups; and determining the correction for a group out of the plurality of groups by applying a model to the metrology data, the model comprising at least a group-specific correction component and a common correction component.

In an aspect, there is provided a computer program comprising program instructions operable to perform a method as described herein when run on a suitable apparatus.

BRIEF DESCRIPTION OF THE DRAWINGS

Embodiments of the invention will now be described, by way of example only, with reference to the accompanying schematic drawings, in which.

DETAILED DESCRIPTION

Figure 1:
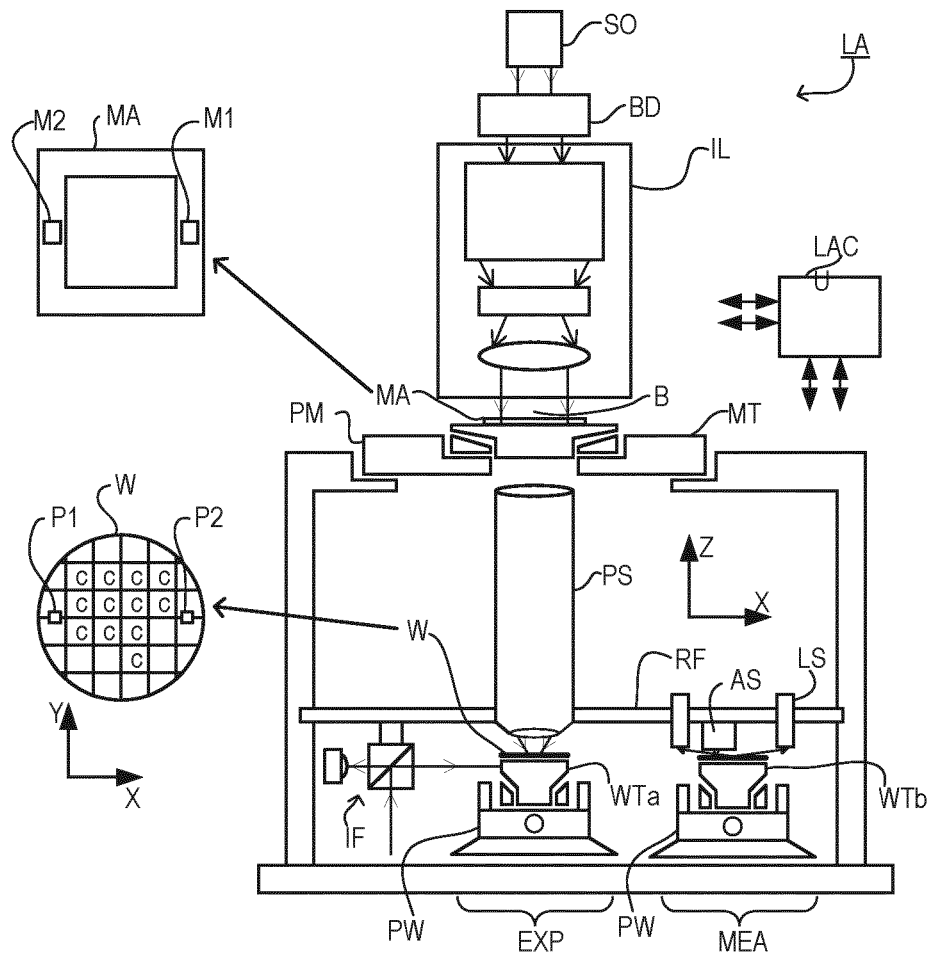
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

Lithographic apparatus LA in this example is of a so-called dual stage type which has two substrate tables WTa and WTb and two stations—an exposure station and a measurement station—between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks may deviate from the ideal grid. Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
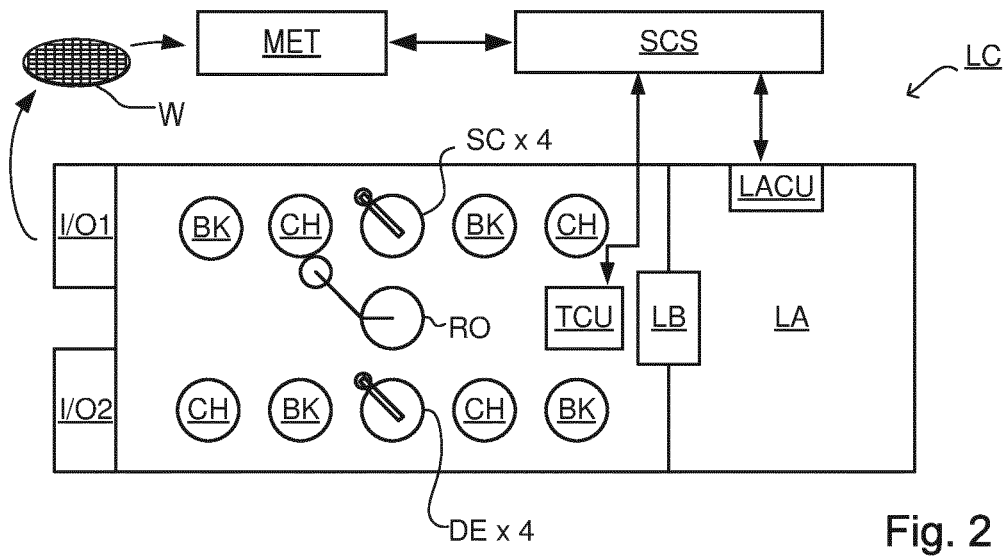
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and/or one or more bake plates BK, e.g. for conditioning the temperature of substrates W e.g. for conditioning solvents in a resist layer. A substrate handler, or robot, RO picks up substrates W from input/output ports I/O1, I/O2, moves them between the different processing apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine values of one or more properties of the substrates W, and in particular, how value of one or more properties of different substrates W vary or how values of one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Figure 3:
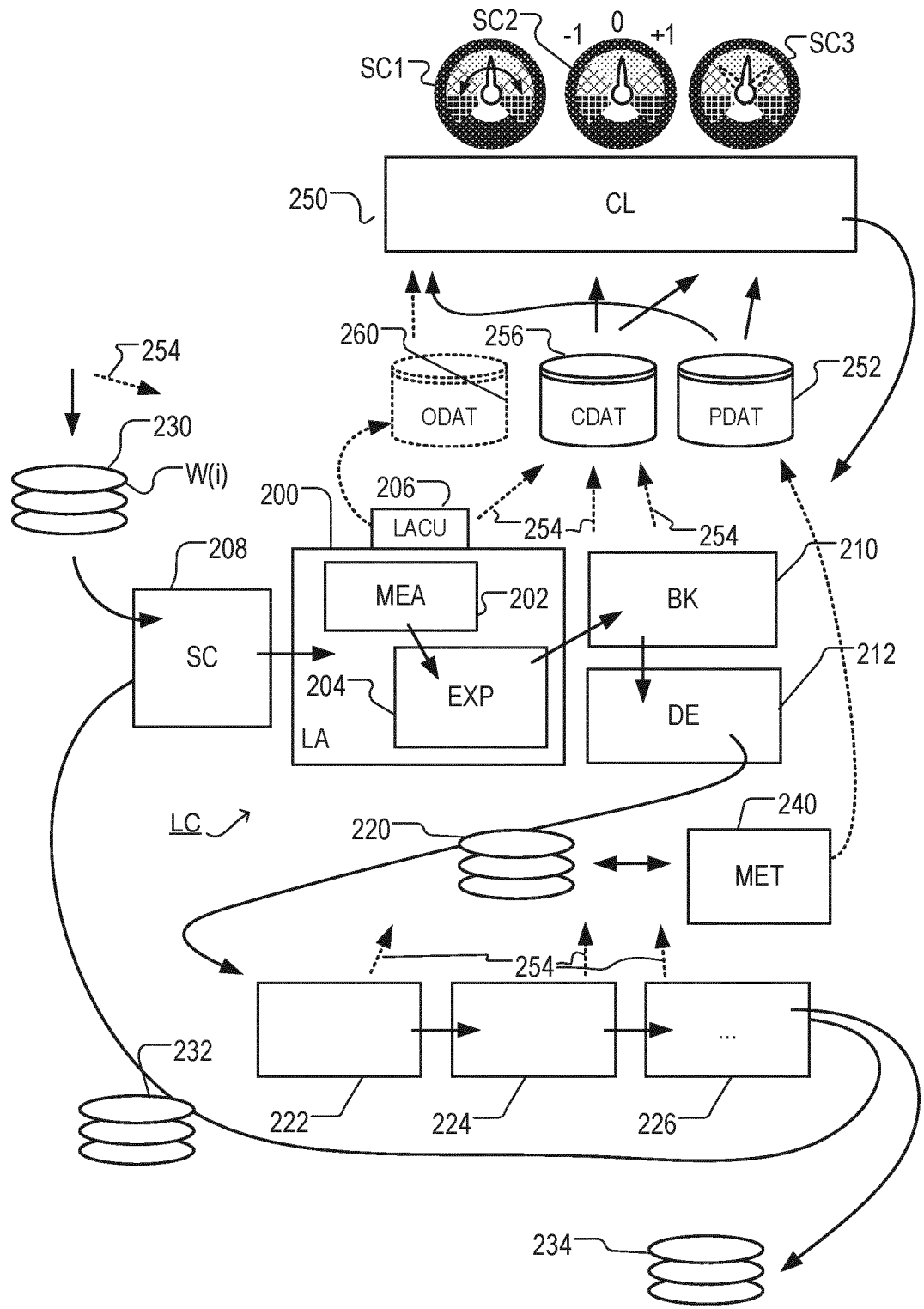
FIG. 3 shows schematically use of the lithographic apparatus and lithographic cell of FIGS. 1 and 2 together with one or more other apparatuses forming a manufacturing facility for manufacturing, e.g., semiconductor devices, the facility including a control apparatus implementing manufacturing optimization technology.

FIG. 3 shows the lithographic apparatus LA and the lithocell LC in the context of an industrial manufacturing facility for, e.g., semiconductor or device products. Within the lithographic apparatus (or "litho tool" 200 for short), the measurement station MEA is shown at 202 and the exposure station EXP is shown at 204. The control unit LACU is shown at 206. As already described, litho tool 200 forms part of a "litho cell" or "litho cluster" that also includes a coating apparatus SC, 208 for applying photosensitive resist and/or one or more other coatings to substrate W for patterning by the apparatus 200. At the output side of apparatus 200, a baking apparatus BK, 210 and developing apparatus DE, 212 are provided for developing the exposed pattern into a physical resist pattern. Other components shown in FIG. 3 are omitted, for clarity.

Once the pattern has been applied and developed, patterned substrates 220 are transferred to one or more other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

The described manufacturing process comprising a sequence of patterning process steps is just one example of an industrial process in which the techniques disclosed herein may be applied. The semiconductor or device manufacturing process includes a series of patterning steps. Each patterning process step includes a patterning operation, for example a lithographic patterning operation, and a number of other chemical and/or physical operations.

The manufacture of devices involves many repetitions of such processing, to build up device structures with appropriate materials and patterns, layer-by-layer on the substrate. Modern device manufacturing processes may comprise 40 or 50 individual patterning steps, for example. Accordingly, substrates 230 arriving at the litho cluster may be newly prepared substrates, or they may be substrates that have been processed previously in this cluster 232 or in another apparatus/cluster entirely. Similarly, depending on the required processing, substrates on leaving apparatus 226 may be returned for a subsequent patterning operation in the same litho cluster (such as substrates 232), they may be destined for patterning operations in a different cluster (such as substrates 234), or they may be finished products to be sent for dicing and packaging (such as substrates 234).

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the processing on different substrates Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. Parallel processing may also be performed in different chambers within a larger apparatus. Moreover, in practice, different layers often involve different etch processes, for example chemical etch, plasma etch, etc., according to the details of the material to be etched, and special requirements such as, for example, anisotropic etching.

The previous and/or subsequent processes may be performed in other lithography apparatuses, as just mentioned, and may even be performed in different types of lithography apparatus. For example, one or more layers in the device manufacturing process which are very demanding in terms of, e.g., resolution and/or overlay may be performed in a more advanced lithography tool than one or more other layers that are less demanding. Therefore, one or more layers may be exposed in an immersion type lithography tool, while one or more others are exposed in a 'dry' tool. One or more layers may be exposed in a tool working at DUV wavelengths, while one or more others are exposed using EUV wavelength radiation.

Also shown in FIG. 3 is a metrology apparatus (MET) 240 which is provided for making measurements of one or more parameters of the products at desired stages in the manufacturing process. A common example of a metrology station in a modern lithographic manufacturing facility is a scatterometer, for example an angle-resolved scatterometer or a spectroscopic scatterometer, and it may be applied to measure one or more properties of developed substrates at 220 prior to etching in the apparatus 222. Using metrology apparatus 240, it may be determined, for example, that a performance parameter such as overlay or critical dimension (CD) does not meet specified accuracy requirements in the developed resist. Prior to the etching step, the opportunity exists to strip the developed resist and reprocess one or more of the substrates 220 through the litho cluster. Moreover, the metrology results from the apparatus 240 can be used to maintain accurate performance of the patterning operations in the litho cluster, by making small adjustments over time, thereby reducing or minimizing the risk of products being made out-of-specification, and requiring re-work. Of course, metrology apparatus 240 and/or one or more other metrology apparatuses (not shown) can be applied to measure one or more properties of the processed substrates 232, 234, and/or of incoming substrates 230.

Typically the patterning process in a lithographic apparatus LA is one of the most significant steps in the processing which involves high accuracy of dimensioning and placement of structures on the substrate W. To help ensure this high accuracy, three systems may be combined in a control environment as schematically depicted in FIG. 3. One of these systems is the litho tool 200 which is (virtually) connected to a metrology apparatus 240 (a second system) and to a computer system CL 250 (a third system). A desire of such an environment is to optimize or improve the cooperation between these three systems to enhance an overall so-called "process window" and provide one or more tight control loops to help ensure that the patterning performed by the lithographic apparatus LA stays within a process window. The process window defines a range of values of a plurality of process parameters (e.g. two or more selected from dose, focus, overlay, etc.) within which a specific manufacturing process yields a defined result (e.g. a functional semiconductor device)—typically a range within which the values of the process parameters in the lithographic process or patterning process are allowed to vary while yielding a proper structure (e.g., specified in terms of an acceptable range of CD (such as +−10% of a nominal CD)).

The computer system CL may use (part of) the design layout to be patterned to predict which one or more resolution enhancement techniques to use and to perform computational lithography simulations and calculations to determine which patterning device layout and lithographic apparatus settings achieve a largest overall process window of the patterning process (depicted in FIG. 3 by the double arrow in the first dial SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second dial SC2).

The metrology tool MET may provide input to the computer system CL to enable accurate simulations and predictions, and may provide feedback to the lithographic apparatus LA to identify possible drift, e.g. in a calibration status of the lithographic apparatus LA (depicted in FIG. 3 by the multiple arrows in the third dial SC3).

Computer system 250 implements a form of feedback control based on a combination of (i) first data or "preprocessing data" associated with substrates before they are processed in a given processing step (for example a lithography step) and (ii) second data or "post-processing data" that is associated with the substrates after they have been processed. As an example of pre-processing data, computer system 250 has access to context data CDAT. This context data may be data not obtained from the products themselves, but representing all or part of the processing history of individual product units (e.g., wafers or other substrates), or batches of product units. As an example of pre-processing data, historic performance data PDAT is illustrated in FIG. 3, which may include for example measurements of overlay and/or CD made by metrology apparatus 240, and context data CDAT associated with individual substrates. Computer system 250 therefore has access to historic performance data PDAT, which is stored in storage 252. Arrows 254 throughout the diagram illustrate how context data may come from any of the apparatuses. Context data may also arrive with the new substrates 230. For example, the context data may record what types of process steps have been applied, which one or more individual apparatuses have been used in the performance of those steps, and what one or more parameters were applied by those one or more apparatuses (for example a setting of temperature or pressure while in etching apparatus 222, or a parameter such as an illumination mode, an alignment recipe, etc. in the litho tool 200). The context data is stored in storage 256 for use by the computer system 250.

The performance data PDAT may be regarded as an example of object data used in some embodiments of the techniques disclosed herein. Other examples of pre-processing data may include object data ODAT derived from measurements made (directly or indirectly) on the product units in advance of or during performance of the processing. FIG. 3 shows this object data optionally collected and stored in a database 260. Such object data may be data measured on the product units themselves, or measured on other parts involved in the industrial process. As one example, the object data stored in a database 260 may comprise the alignment data conventionally obtained by the lithographic apparatus 200 using alignment sensor AS in the measurement station 202. As this data representing detailed measurements of positions of marks in the X-Y plane of the substrate is obtained inherently as part of the normal patterning operation, little or no penalty is incurred by instructing the control unit LACU, 206 to store the data in the object data storage 260. Alternatively, or in addition to the alignment data, the object data may include height data obtained using level sensor LS, and/or "wafer quality" signals from the alignment sensor AS or the like. In other embodiments, the object data may include data measured elsewhere in the system, and not on the product units themselves. An example of such object data might be patterning device (mask or reticle) alignment data obtained using the patterning device alignment marks M1, M2 and/or one or more sensors in the one or more substrate supports of the lithographic apparatus of FIG. 1.

The term "object data" as used in in this description may encompass a wide variety of data that may be gathered in the manufacturing facility, either for historic product units, or new product units to be processed. "Object data" as used in herein may encompass both the performance data PDAT (measured from processed product units after processing and stored in storage 252) and the other types of object data ODAT (measured from product units or other systems before and/or during processing and stored in storage 260). Depending on context, this object data may be "pre-processing data" or "post-processing data". Object data collected in advance of a particular processing step, including for example alignment data or height data measured immediately prior to exposure of a substrate, may be regarded as a form of pre-processing data as described herein. The same object data may be regarded as performance data, e.g., post-processing data, with respect to a previous processing step. For example, alignment marks may contain fingerprints of previous etching or polishing steps. Therefore, in some embodiments, a piece of object data may serve as post-processing data (historic performance data) in the control loop of one processing step, and as pre-processing data (similar to the context data) in the control loop of a later processing step.

While FIG. 3 shows separate storage 252, 256, 260 for each of the context data, performance data and other object data, it will be appreciated that these different types of data may be stored in one common storage unit, or may be distributed over a larger number of storage units, from which particular items of data can be retrieved when required. Further, while the context data 254 is shown as emanating from individual apparatuses 222, 224, etc., the data may be collected through a central control system that controls the operation of the lithocell and/or the manufacturing plant as a whole.

Each record in the object data, context data and performance data storage is labeled with a unique identifier. Noting that an individual substrate might pass repeatedly through the same litho tool in the course of a manufacturing process, or might pass through different tools all measuring the same marks, it is possible to collect data for the same product unit at different stages of the manufacturing process. Each of these instances of measurement can be treated in the analysis as an independent product unit. In the case where there are multiple instances of the same substrate being measured at different stages in a complex manufacturing process, however, the object data will include an identifier that uniquely identifies not only the individual substrate, but the stage of processing in which it has been measured. Typically, in a lithographic process, different instances of the same substrate will be associated with patterning successive layers of a device structure.

A relatively new technology area is the domain of machine learning. Methods relating to this technology are nowadays used to improve prediction of process parameters based on recognition of patterns present within the acquired data (measurements and context data). Additionally, machine learning techniques may be useful to guide the user in selecting data that is most useful for process control purposes.

As a (semiconductor) manufacturing process involves multiple processing apparatuses (one or more lithographic apparatuses, one or more etching stations, etc.) it may be beneficial to optimize the process as a whole, e.g. take specific correction capabilities associated with individual processing apparatuses into account. This leads to the perspective that control of a first processing apparatus may be (partly) based on one or more known control properties of a second processing apparatus. This strategy is commonly referred to as co-optimization. Examples of such a strategy are the joint optimization of a lithographic apparatus and a density profile of a patterning device and/or a lithographic apparatus and an etching station. More information on co-optimization may be found in PCT patent application publication nos. WO 2017/067748 and WO 2017/144343, which are incorporated herein in their entireties by reference.

As discussed, context data may be used for purposes of process control. Machine learning techniques may be utilized to recognize patterns in context data and subsequently relate them to an expected impact on one or more characteristics (such as overlay, CD, edge placement error (EPE), etc.) of substrates being subject to a process. Known methods depend on the availability of historic post-processing data, such as overlay data, CD data or yield data as measured on a large set of processed substrates for which also pre-processing (context) data (data associated with substrates prior to undergoing a certain process of interest) is available.

To relate these two classes of data typically the post-processing data is clustered based on well-known methods such as k-means and/or PCA analysis. Subsequently, relations between the post-processing data clusters and pre-processing data is established, in order to formulate a model capable of assigning to be processed substrates to a certain expected characteristic of post-processing data, based purely on its associated pre-processing data. Examples of such systems are described in PCT patent application publication no. WO 2017/060080, which is incorporated herein in its entirety by reference.

In a few cases the pre-processing data has a limited set of associated parameters. For example, when only an identification number or code (ID) of an etch chamber is recorded to characterize the pre-processing data associated with to-be-processed substrates. In this case it is often straightforward to establish a relation between a cluster of substrates pertaining to a certain cluster of post-processing data and a value of the parameter comprised within the pre-processing data. In an example a certain cluster of substrates associated with a certain class of overlay data (fingerprint) may be assigned to a value of the etch chamber ID, e.g., substrates associated with prior processing by chamber 2, e.g., may be linked to radial overlay fingerprints while substrates associated with prior processing by chamber 5, e.g., may be linked to saddle-shaped overlay fingerprints. Hence when it is known that a to-be-processed substrate has passed via etch chamber 5 the process (control) can be adjusted to compensate a saddle shaped overlay fingerprint by applying an adequate overlay correction to the process (for example, to a lithographic process).

In general, however, pre-processing data may comprise context data relating to at least one, and up to many, process steps. In a modern semiconductor or other device manufacturing facility (generally referred to as a "fab" or "wafer fab" for short) many processing steps, on many processing apparatuses/tools, may be performed and may potentially be used for context based control purposes. Even for a single layer, the steps may comprise a lithographic apparatus (e.g., a scanner exposure) step followed by a number of different etch steps (e.g., in a double or multiple patterning process, e.g., self-aligned multiple patterning SAMP, there may be four or more separate etch steps). Each of these steps have an associated context value, e.g., a particular table/chuck for the lithographic apparatus step and/or a different chamber for each of the etch steps, which are typically performed using different etch tools. A fab typically will utilize a plurality of lithographic apparatuses and etch devices for a particular manufacturing process.

A process control method will aim to correct for the impact of these multiple processing apparatuses on performance after etch. In order to do so, final performance parameter fingerprints (e.g., a spatial distribution of values or their residuals for the performance parameter over a substrate/die/field) within the post-processing data are decomposed into individual tool contributions to this fingerprint. Examples of such a performance parameter fingerprint are: overlay fingerprint, CD fingerprint, yield fingerprint, focus fingerprint, and/or EPE fingerprint. Using the example of CD, the final CD fingerprint can be decomposed into a fingerprint caused by deposition, a fingerprint caused by lithography, and a fingerprint caused by each etching step.

One goal of fingerprint decomposition is to determine a fingerprint library. This library in turn is used to compute (estimate) the end-performance fingerprint (and corrections therefor) of each new substrate based on the pre-processing data (and more specifically, context data or context labels) relating to each apparatus station used to process a particular substrate.

Therefore, to implement such a method of decomposing end-performance fingerprints into individual tool contributing fingerprints using present techniques, there has to be a large amount of post processing data, relating to each pre-processing data combination, hereafter referred to as a process thread. A process or context thread in this context is the particular combination of processing stations within the processing apparatuses, used to process a particular substrate in a manufacturing process (e.g., to form a layer). A processing apparatus may therefore comprise a lithographic apparatus (e.g., a scanner), etch apparatus, deposition apparatus or any other processing apparatus used in a semiconductor or device manufacturing process, and a processing station may comprise a sub-station (or the only station used, e.g., if there is just one) of the processing apparatus (e.g., the chuck/stage of a dual-stage or multi-stage lithographic apparatus, the etch chamber of an etch apparatus, etc.). Therefore, a process thread for a manufacturing process comprising 5 steps a) to e) on a particular substrate, may comprise (purely for example): a) stage 1 of lithographic apparatus 3, b) chamber 1 of partition etch tool 2, c) chamber 2 of spacer etch tool 1, d) chamber 2 of clean etch tool 4 and e) chamber 1 of final etch tool 3.

It can therefore be appreciated that the number of possible combinations of processing stations for each process thread are great. As such, the amount of substrates measured to construct a fingerprint library will grow very quickly with the amount of processing steps, number of individual processing apparatuses per processing step, and number of individual processing stations per processing apparatus. For many multiple-step processes, this will increase to a level where present fingerprint decomposition techniques are no longer feasible in practice.

Typically, the substrates are processed in lots. A lot may comprise substrates which will all be processed on the same combination of processing apparatuses within a fab, although not necessarily the same processing stations. While a lot conventionally comprises 25 substrates, the proposed methods may use lots of any number.

In overlay run to run (often abbreviated as run2run) control, an overlay fingerprint is estimated from a set of substrates (e.g., wafers) measured per lot. These substrates are fit to a fingerprint, and then this fingerprint is typically mixed with earlier fingerprints to create a new fingerprint estimate using, for example, an exponentially weighted moving average (EWMA) filter. Alternatively, the fingerprint may simply be updated periodically, or even measured once and held constant. A combination of some or all of these approaches is also possible. The results of this calculation are then run through an optimization job in order to set one or more apparatus actuators (e.g., one or more lithographic actuators) for the next lot to reduce or minimize overlay.

A refinement of this concept is based on substrate level grouping control (WLGC), wherein each critical context (e.g., etcher or other significant tool identifier or tool state) is used to group a substrate into a small number of control threads. These control threads are then independently controlled using an EWMA estimate. Individual contexts (e.g., one or more etchers and one or more lithographic apparatuses) are assumed to each contribute to a substrate fingerprint describing a spatial distribution relating to a parameter (e.g., CD or overlay) observed on a substrate, and a model which linearly combines these contributions is fit to determine the coefficients.

For the run2run control case used in WLGC, while there is a common fingerprint available, the grouping of the substrates in individual threads means that only a few substrates per thread (context) are available for measurement, and because it may take a long time between occurrences of exactly the same thread, the fingerprint is updated less often. For instance, if a group is defined as a set of etchers, those etchers may be used only every few days rather than every few hours, resulting in a fingerprint associated with the group of etchers which is more out of date when that particular fingerprint is needed for control purposes. As the etcher is typically responsible for a relatively small proportion of the total variation in the overlay fingerprint, while other sources of variation are typically responsible for a larger proportion (e.g., a common fingerprint, of which the lithographic apparatus is significant portion), information from the many lithographic apparatus measurements performed between the lots for which a corresponding group is available for measurement may not be used in run2run control. This could result in a significant loss of overlay correction performance.

A method will be described for fitting the contributions associated with different threads or groups as a sum to measured (performance) data in a stable running fashion, sharing information continually, for example in the overlay domain. An embodiment provides a way of updating the contribution of the lithographic apparatus to the measurement (performance data), which is common to all threads associated with that particular lithographic apparatus, whenever new measurement data becomes available, while leaving the contribution of a specific group relatively untouched, so an unmeasured group is only out of date in its group-specific contribution, not its lithographic apparatus contribution.

Commonality between fingerprints associated with different threads (groups) may be used to enhance the determining of corrections for an apparatus, such as a lithographic apparatus. Typically overlay (measurement) data is used for run to run control of an apparatus (such as a lithographic apparatus).

Typically a large amount of noise is present in the overlay signal. However a significant portion of this noise (spatial fingerprint across substrates and temporal evolution) is not thread (group) specific, but is correlated between groups of substrates. A decrease in sampling rate of metrology data, when adopting a purely group-specific control strategy, may lead to a significant impact of noise on the determined (group-specific) apparatus correction. In this case the noise is effectively incorrectly interpreted as a proper input signal for control.

Consequently, proposed herein is a framework configured to provide apparatus control based on metrology data which takes the thread structure into account, while being equipped to share information between different threads in the manufacturing environment.

Figure 4:
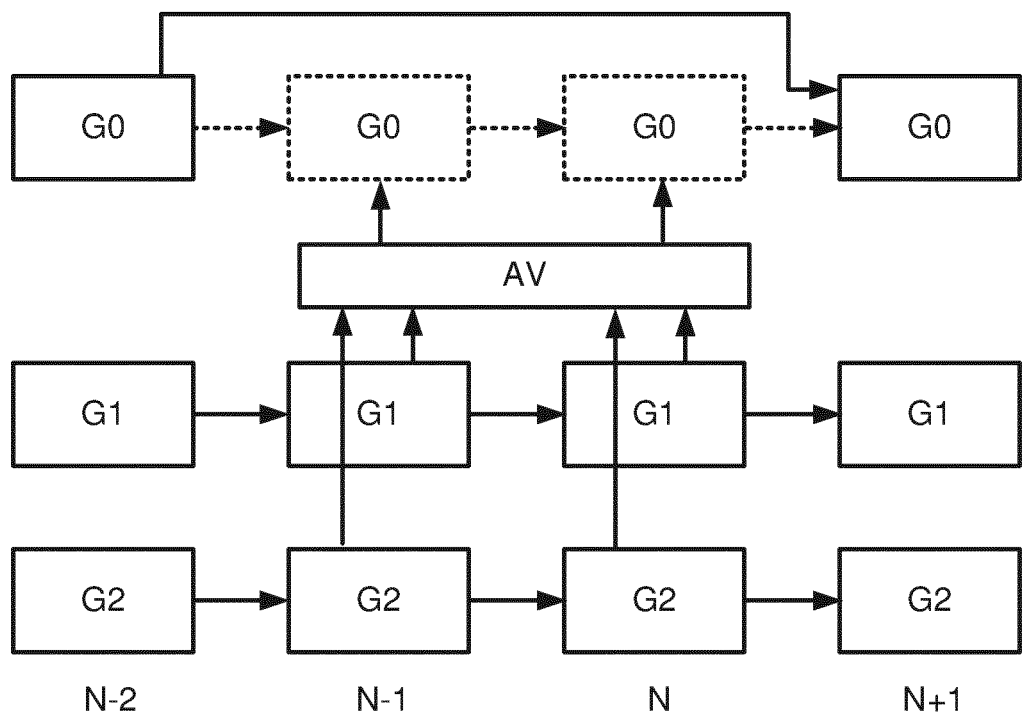
FIG. 4 comprises a schematic overview of run to run control according to an embodiment of the invention.

FIG. 4 illustrates a statistical co-optimization framework for determining group and lithographic apparatus fingerprints. The framework enables the combining of information between groups. The framework aims to extract maximum information from all groups while preserving the difference between the (metrology) signals observed between groups. This approach may be extended to include information from multiple lithographic apparatuses and to even enable combination of information between layers applied to the substrates, and potentially also information between related products.

More specifically, FIG. 4 illustrates an example of a semiconductor or device manufacturing process having at least three threads (groups) of substrates being processed by a lithographic apparatus. For example each individual group may be related to a specific tool (e.g., lithographic apparatus or etcher) or thread of tools used in processing the substrate (a process or context thread). Alternatively, each group may be defined based on a fingerprint of data associated with the substrate of interest. For example, the fingerprint could be related to pre-processing data from a lithographic apparatus (or a stand-alone alignment station), such as a height map or alignment data of the substrate as measured before being exposed by a lithographic apparatus.

In FIG. 4, the three groups are referred to as G0, G1 and G2 and are represented at four different lots (time periods) N−2, N−1, N, N+1. For example, group G0 is associated with a first etch apparatus, group G1 with a second etch apparatus and group G2 with a third etch apparatus. In this example, correction of a lot, e.g., lot N+1, is based on metrology data associated with substrates from at least an immediately preceding lot, e.g., lot N. This correction may simply be based on data from the previous lot only, or may be based on a weighting of corrections associated with a number of preceding lots (e.g., lots N, N−1 and N−2); for example so as to smoothen overly abrupt changes in corrections resulting from process changes. This is depicted by the arrows between the individual blocks of groups G1, G2 for which data from an immediate preceding lot is always available (for the timeframe shown here). In general, however, this is not necessarily the case and the only data available for determining a correction for a particular group may be older (e.g., outdated or at least partially obsolete) data associated with lots N−1, N−2 or potentially further back in time. This can result in a correction being based on outdated data.

Mathematically, an exemplary existing calculation of corrections based on overlay data may be quite straightforward. Per substrate group (thread), the correction coefficients '$a_1 \ldots a_N$' for overlay X control and control coefficients '$b_1 \ldots b_N$' for overlay Y control (where X and Y are mutually orthogonal directions in a substrate plane) are determined by (point wise) least square minimization of actually measured overlay data $OV_x$, $OV_y$, based on the most recent data available for the group, and a correction, typically applied by a lithographic apparatus:

$$\vec{a}, \vec{b} = \underset{\vec{a},\vec{b}}{\operatorname{argmin}} \sqrt{\left\|\left(\vec{OV}_x - \sum_{i=1}^{N} a_i \vec{C_i}\right)\right\|^2 + \left\|\left(\vec{OV}_y - \sum_{i=1}^{N} b_i \vec{C_i}\right)\right\|^2} \quad (1)$$

The correction coefficients may be optionally subsequently averaged, e.g., via EWMA.

Here, $\vec{C_i}$ is a vector comprising the ith correction basis function which describes the spatial characteristic of the applied correction. The optimization procedure can be performed per substrate, per lithographic apparatus or chuck of the lithographic apparatus (e.g., based on a combination of data from all substrates per lithographic apparatus/chuck), or based on a combination of information between lithographic apparatuses and/or chucks.

Returning to FIG. 4, the dashed boxes illustrate missing lot data, i.e., there is no data relating to group G0, lots N−1 and N. This may be the case when a particular control thread (or more generally context) has not been used in processing (one or more) substrates in the immediately preceding or recent lot, and therefore there is no recent metrology data for this control thread or group. In such a situation, for example in a presently used group dedicated control strategy such as WLGC, a customized correction for group G0 would be based on metrology data and/or correction characteristics associated with lots which were processed quite far back in time (here lot N−2, as indicated by the arrow at the top of the Figure connecting the two data boxes). A disadvantage in this is that the most recent data available for determining a new G0 dedicated correction for lot N+1 is from lot N−2, which by now may be outdated metrology and/or correction data.

It is proposed in such circumstances to use corresponding metrology and/or correction data from one or more other groups in place of such missing data (e.g., data which is not available for particular lots within a group, such as the most recent one or more lots, thereby preventing up to date control for substrates). The correction data from one or more other groups may be averaged across these groups (i.e., when from more than one group), for example using a moving average such as an EMWA.

In the example illustrated, there is no measured/obtained data in group G0 corresponding to lots N−1, N. Consequently, substitute data from at least one of the corresponding lots of groups G1 and/or G2 is used in its place. For example, a correction for lot N+1 of group G0 may be based on averaged data from at least lot N (and here also lot N−1) relating to groups G1 and G2, together with the group G0 specific fingerprint based on the most recently available data for that group (from lot N−2), which potentially comprises outdated information. In this manner, a group G0 correction for lot N+1 may be based on the last available data for that group (i.e., lot N−2) supplemented with group G1 and/or group G2 data from lot N and/or N−1, for which no group G0 data is available.

It should be appreciated that, in a moving average embodiment, the averaged information AV from the measured groups G1 and G2 will go through EWMA. As such, the averaged information from groups G1 and G2 is used as a proxy measurement for the missing lots of group G0, and the EWMA is calculated as if no measurements for group G0 are missing.

The averaging step AV may also comprise a processing of the substitute data; for example, to process the (e.g., fingerprint and/or correction) data associated with these groups so as to account for the evolution of the noise component (which is correlated to the noise component of group G0).

As such, commonality between process threads or groups can be used to partly perform a combined fingerprint determination; e.g., to determine a common fingerprint component over groups for a more accurate estimation. This will allow the capture/update of a common portion of the fingerprint more regularly, leading to better temporal noise suppression. Alternatively, such a method can be used to improve the substrate capturing capability: if it is known that some parameters are correlating with other control groups, then these parameters do not need to be determined for every lot. This can allow a fingerprint model to be extended with additional parameters, while maintaining the same spatial noise suppression. Such a method may be achieved by identifying parameters which can be shared over groups. Such a method can also be seen as an extension of WLGC, such that groups are split into new groups, while taking into account a common portion.

In an embodiment, any grouping could be performed on a per-lithographic apparatus basis. Each lithographic apparatus has a unique fingerprint; however the fingerprint over a number of lithographic apparatuses may comprise a shared component (e.g., relating to non-lithographic apparatus aspects such as substrate processing, context etc.). Therefore, a proposal for partial decomposition of the shared component and lithographic apparatus-specific component is disclosed. In another embodiment, the fingerprint over a number of lithographic apparatuses may be decomposed according to some or all of the categories of a hierarchy such as: a global component, a lithographic apparatus component, a chuck component and/or a group and/or context component.

More specifically, it is proposed here (in an embodiment) to depart from the per group (separate) minimization procedure; e.g., as described by Equation (1), and decompose the correction coefficients into group-specific correction coefficients $a_i^g$, $b_i^g$, and shared or global correction coefficients $a_i$, $b_i$, based on fitting to the metrology measurements across all groups. The mathematical framework shown in Equation (2) is an example of an implementation, although one or more other mathematical frameworks may be used:

$$\vec{a}, \vec{b} = \underset{\vec{a}, \vec{b}, \vec{a^g}, \vec{b^g}}{\operatorname{argmin}} \left( \sum_{g=1}^{M} \left( \left\| \overrightarrow{OV}_{x,g} - \sum_{i=1}^{N}(a_i + a_i^g) \cdot \vec{C_i} \right\|^2 + \right. \right.$$

$$\left\| \overrightarrow{OV}_{y,g} - \sum_{i=1}^{N}(b_i + b_i^g)\vec{C_i} \right\|^2 \right) + P_1 *$$

$$\sum (a_i, b_i, a_i^g, b_i^g) \Lambda_1 (a_i, b_i, a_i^g, b_i^g)^T +$$

$$P_2 * \sum |(a_i, b_i, a_i^g, b_i^g)_t - (a_i, b_i, a_i^g, b_i^g)_{t-1}| \Lambda_2 |(a_i, b_i, a_i^g, b_i^g)_t -$$

$$\left. (a_i, b_i, a_i^g, b_i^g)_{t-1}|^T \right)$$

The first term (when considered from left to right) of Equation (2) is a data fidelity term (e.g., per direction x and y) which seeks to provide correction coefficients which are co-optimized across all considered M groups g, where $\vec{C_i}$ is a vector comprising the ith correction basis function. Lithographic apparatus (or chuck) specific terms may be included within the general coefficients, if considered necessary. Here the overlay vector $\overrightarrow{OV}_{x,g}$, $OV_{y,g}$ is now defined per group or per substrate within each group. The second (optional) term is a regularization term which tends to penalize larger correction coefficients (e.g., it favors simpler/the simplest solutions and breaks degeneracy), wherein the matrix $\Lambda_1$ may be the identity matrix or may be configured to include weighting of certain correction coefficients. The third (optional) term is a prior term which feeds information forward between lots; For example, this term uses prior information corresponding to a previous lot (e.g., lot N, corresponding to a time t−1) in the determination of a correction of the lithographic apparatus of one or more subsequent lots, e.g., lot N+1 corresponding to a time t so as to dynamically update the optimization on a lot-to-lot basis. The matrix $\Lambda_1$ is configured to weigh the correction coefficients such that they tend to reflect the existing correlations between the coefficients.

The correction coefficients may be optionally subsequently averaged e.g., using a moving average such as EMWA.

Of course, the framework described by Equation (2) is only an example (with only two categories: group-specific and global). Correction coefficients for other categories may be included, for example for one or both of the other categories in the hierarchy mentioned in previous paragraphs. It should also be clear, as previously mentioned, that it is possible to have one group per context value. As such, strictly speaking, actual grouping is not necessary, only knowledge of which context should be used to decompose or split-up the fingerprint. For example, for 20 etchers, there may be 20 groups, instead of only 4 or 5 (for example). Also, multiple such groupings could be overlapped or stacked, one per each context type of interest. For example, there may be an optimization based on a common grouping and an etcher grouping, then, an additional optimization based on a grouping for a particular CMP step, and/or a grouping for a specific chuck.

The mathematical framework as described above may also be described in terms of probabilities; e.g., as a method for implementing a fully probabilistic estimation. The optimization problem can be written as a (e.g., Bayesian) statistical problem which maximizes a certain probability that the parameters $\vec{a}$, $\vec{b}$ are the optimal correction parameters for a certain group of substrates:

$$\vec{a}, \vec{b} = \underset{\vec{a}, \vec{b}, \vec{a^g}, \vec{b^g}}{\operatorname{argmin}} \left( P_{fit}(\vec{a}, \vec{b}, \vec{a^g}, \vec{b^g}) * P_{reg}(\vec{a}, \vec{b}, \vec{a^g}, \vec{b^g}) * P_{prior}(\vec{a}, \vec{b}, \vec{a^g}, \vec{b^g}) \right) \quad (3)$$

wherein a first probability $P_{fit}$ describes the probability that the correction parameters are optimal when co-optimized across the groups (this corresponds to the first or data fidelity term of Equation (2)), a second probability $P_{reg}$ describes the probability that the correction coefficient vectors are optimal when being bound by a certain norm; e.g., to penalize large correction vectors (this corresponds to the second term or regularization term of Equation (2)), and a third probability $P_{prior}$ describes the probability of the correction parameters being optimal when taking an earlier state (at one or more earlier times/lots) into account (this corresponds to the third or prior term of Equation (2)).

In a broader sense, this framework would enable a probabilistic approach to computationally deriving fingerprints associated with a certain group/thread. For example, in an embodiment, the third term (e.g., third probability $P_{prior}$) enables one or more further enhancements, by facilitating encoding of other or complementary data or prior information. The complementary data may comprise one or more selected from: alignment data, levelling data, context data, maintenance action data (e.g., indicative as to when a maintenance action was last performed), other parameter data (e.g., CD data for an overlay optimization), or behavior observed on one or more other layers and/or products in the optimization. Alternatively, or in addition, the third probability $P_{prior}$ can use data from more than one lot (e.g., the immediately preceding lot); instead it can be used to encode data from multiple preceding lots; e.g., to encode a history of recent lots.

In another embodiment, group fingerprints may be shared between different lithographic apparatuses (e.g., scanners), for example so that a lithographic apparatus at startup already knows the grouping structure for a particular process or processing arrangement. In some cases, group fingerprints may be observed to be relatively stable, while lithographic apparatus fingerprints may be observed to be more unstable. By way of a specific illustrative example, group fingerprints may already have been learned when a new lithographic apparatus is switched on. The new lithographic apparatus has some unknown common fingerprint, but all the group fingerprints are already known. This means that all the known group fingerprints can be immediately used by the new lithographic apparatus, improving overlay more quickly for that lithographic apparatus.

In an embodiment, process monitoring data (for example, maintenance actions and other explicit events) can be fed in, for example, to flag that a fingerprint associated with a specific group/thread/chamber may be expected to change.

In an embodiment, a confidence number or weighting may be determined, based on complementary or auxiliary data. Such a confidence number may be indicative as to how trustworthy a measurement or set of measurements is, e.g., how well the data describes the true parameter values/variation. For example, the complementary data might suggest that the (e.g., primary) metrology data from a substrate is an outlier and not indicative of a true overlay fingerprint. Such metrology data may be given a low (or zero) weighting in an optimization to determine a (e.g., group-specific) correction for an apparatus. The complementary data may comprise, for example, one or more of alignment data, leveling data or context data from this layer and/or an earlier layer, and/or overlay, CD, or focus data from a previous layer. In this manner, alignment and/or leveling data (for example) obtained from, e.g., a lithographic apparatus may be used to adjust parameters in a co-optimization. Another use for complementary data is to determine a fingerprint trend, e.g., to determine which direction a fingerprint may be expected to shift. Such a method may comprise learning a relationship between the metrology apparatus used to perform a measurement and one or more health indicators (e.g., KPIs). The one or more KPIs can be included in the model to predict inaccuracy in a measurement; a probability or weighting based on this prediction can then be included in the optimization (e.g., as an additional product term in Equation (3)).

Such complementary data can also be used to predict or determine whether a fingerprint is stable. This may comprise modeling evolution of the fingerprint based on the complementary data (e.g., alignment data) and history, to detect whether the fingerprint is changing or stable. This may facilitate early detection of an unstable fingerprint. A drifting etch chamber should be detectable when a substrate reaches any etcher, lithographic apparatus, and metrology tool. For example, if etcher information is being shared between lithographic apparatuses, then when a first lithographic apparatus begins to drift, the drift is learned and incorporated into the shared etcher fingerprint, which is then usable on a second lithographic apparatus despite this second lithographic apparatus having never "seen" the etcher in this new state. Additionally, even if information is not allowed to be shared between etchers, the prior responsible for keeping the etcher fingerprint stable can be made to be weaker when the first lithographic apparatus observes a change, allowing an etcher to adjust more quickly based on its apparent instability on another lithographic apparatus.

Figure 5:
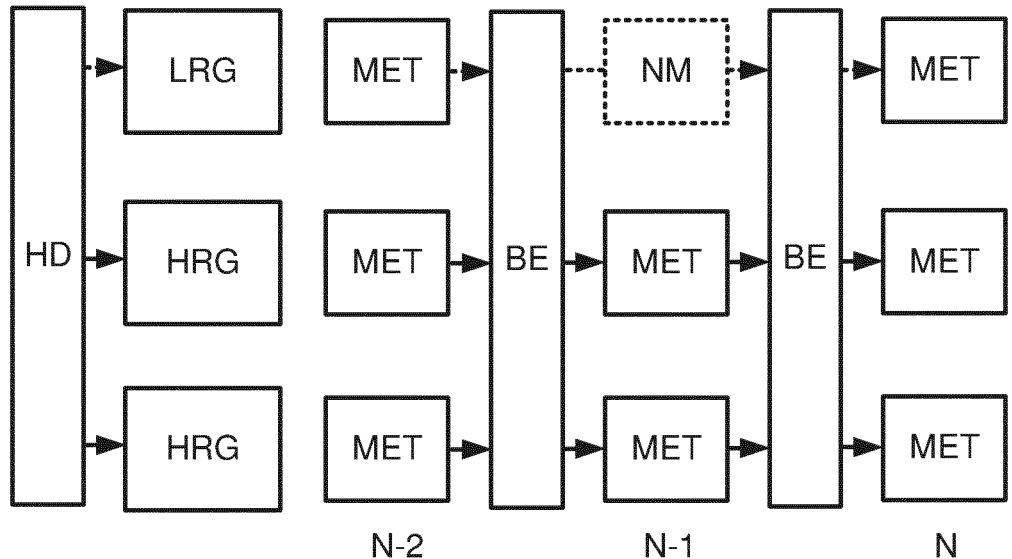
FIG. 5 depicts a Bayesian framework of inferring measurement results according to an embodiment of the invention.

FIG. 5 illustrates a variation on the concepts described herein, where groups are categorized and/or ranked according to one or more criteria, and scheduling metrology actions according to this categorization/ranking, while using the framework as described to compensate for missed or skipped metrology actions. As in the previous embodiments, the framework is basically a Bayesian framework for mixing information between groups. Historic data HD (e.g., based on context and/or other metrology data) is analyzed and groups are identified and categorized as, for example, a first 'low risk' group LRG associated with a moderate need for correction (e g small amplitude and/or stable correction profile) and two 'high risk' groups HRG (e.g. needing stronger correction and/or demonstrating faster fluctuations per lot). Metrology scheduling can then be based on this categorization such that, for example, the low risk group has less frequent metrology MET resulting in one or more skipped lots NM for which no metrology MET is performed. Bayesian estimation BE is employed, as described, which compensates for the skipped lots NM by combining data from the other groups and (optionally) from multiple lots.

The historic data HD may comprise, for example, a measure of temporal correlation over time, which may be based on one or more uncertainty metrics derived from other metrology. This historic data HD can be balanced against variance or noise data. Such a method may use, for example, a variance model which predicts high variance events based on other metrology, as well as a learned drift time.

Of particular note is that, if two groups show the same trend, then it may be inferred that another group (e.g., an unmeasured group) will also show the same trend. The Bayesian framework exploits this by co-optimizing over all groups in the manner already described, such that the shared trend will be reflected in corrections determined for the unmeasured (e.g., low risk) group. Larger noise suppression can be achieved as the Bayesian estimation BE process intrinsically averages out noise associated with the measurements (analogously to the use of a Kalman filter), making use of the fact that the noise is correlated between the different groups.

Of course, any categorization might have more than two categories (e.g., include a medium risk group) or the groups may be ranked in terms of risk. The metrology scheduling may be different to that shown, with the number of skipped lots determined from the risk category and/or ranking.

Instead of the Bayesian methods described, alternative methods for sharing information between lots and/or groups could also be employed. One such method is a Wiener filter which, given first and second groups, is able to predict data for the first group based on measurement data of the second group and vice versa.

Figure 6:
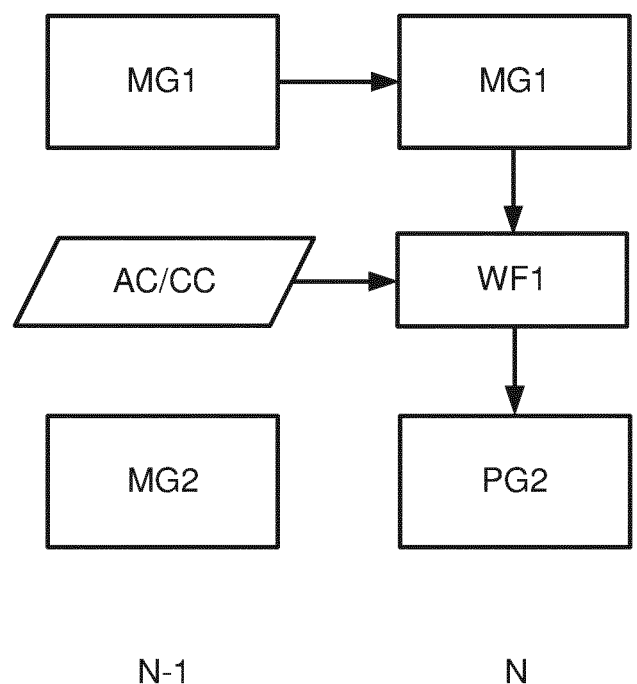
FIG. 6 illustrates the use of a Wiener filter to infer characteristics of a substrate associated with an unmeasured group based on measured data according to an embodiment of the invention.

FIG. 6 illustrates the use of a Weiner filter is this manner Initially, a training phase is performed where historic data over several lots is used to calculate autocorrelation data and cross-correlation data for each group individually and between each pair of groups. This autocorrelation and cross-correlation data AC/CC is then used to train a Weiner filter WF1 for each pair of groups being considered in order to generate one or more filter parameters. The Weiner filter describes the relationship between corresponding parameters of pairs of groups on a per-parameter basis. The configured/trained Wiener filter WF may then be used to predict characteristics of groups which are not measured based on data available associated with other groups. In the example illustrated, the trained Weiner filter WF1 is used to infer predicted data PG2 for a second group MG2 (lot N) based on measured data MG1 from a first group. In this manner, the trained Weiner filter can be used for predicting an unmeasured group signal using a measured group signal in order to provide per-group feedback control. The autocorrelation/cross-correlation should ideally be re-generated/retrained periodically to update one or more Wiener filter parameters.

The Weiner filter approach enables a prediction of an unmeasured group to be based on historic data over a number of lots. The Weiner filter approach also facilitates a separate lithographic apparatus fingerprint to be tracked in addition to the different group fingerprints.

Further embodiments are disclosed in the list of numbered clauses below:

1. A method for determining a correction of an apparatus, the method comprising:
  obtaining a group structure associated with a processing history and/or similarity in fingerprint of substrates to be processed by a lithographic apparatus;
  obtaining metrology data associated with a plurality of groups within the group structure, wherein the metrology data is correlated between the groups; and
  determining a correction for a group out of the plurality of groups, the correction being determined using at least a group-specific correction component and a common correction component.

2. The method according to clause 1, wherein, in addition to the group-specific correction component and the common correction component, there is further provided a lithographic apparatus component and/or a chuck component.

3. The method according to clause 1 or clause 2, wherein the determining the correction comprises applying a model to the metrology data, the model comprising at least the group-specific correction component and the common correction component.

4. The method according to clause 3, wherein the model comprises one or more group-specific correction parameters and one or more common correction parameters.

5. The method according to clause 4, wherein the one or more group-specific correction parameters and one or more common correction parameters are coefficients of base functions representing a spatial characteristic of the correction.

6. The method according to clause 4 or clause 5, wherein the determining the correction comprises performing an optimization which optimizes the one or more group-specific correction parameters and one or more common correction parameters with respect to the metrology data.

7. The method according to clause 6, wherein the optimization comprises a stacked optimization which comprises multiple of said optimizations.

8. The method according to clause 6 or clause 7, wherein the optimization comprises minimizing a cost function between the metrology data and a combination of base functions, wherein the one or more group-specific correction parameters and one or more common correction parameters serve as weighting factors.

9. The method according to clause 8, wherein the minimizing comprises minimizing a least sum square of a difference to fit the model to the metrology data.

10. The method according to clause 6 or clause 7, wherein the optimization comprises a fully probabilistic estimation of the one or more group-specific correction parameters and one or more common correction parameters.

11. The method according to clause 10, wherein the optimization maximizes a probability that the one or more group-specific correction parameters and one or more common correction parameters are optimal with respect to the metrology data.

12. The method according to any of clauses 3 to 11, wherein the model is regularized to prefer correction parameters which are close to previously determined correction parameters.

13. The method according to clause 12, wherein the previously determined correction parameters relate to one or more substrates from a present lot and/or one or more previous lots.

14. The method according to any of clauses 3 to 13, wherein the model is regularized to prefer correction parameters having a small absolute value.

15. The method according to any of clauses 3 to 14, wherein the model is regularized to avoid degeneracy of the solution of the fitting.

16. The method according to clause 1 or clause 2, wherein the determining the correction is performed by application of a Weiner filter to the metrology data corresponding to a group other than the group for which the correction is being determined.

17. The method according to clause 16, comprising training one or more Weiner filters, each Weiner filter corresponding to a particular pair of groups of the plurality of groups.

18. The method according to clause 17, wherein the training comprises calculating, individually and between each pair of groups, autocorrelation data and cross-correlation data for metrology data corresponding to each group, the autocorrelation data and cross-correlation data used to generate one or more filter parameters for the Weiner filter.

19. The method according to any of clauses 16 to 18, comprising tracking a fingerprint relating to a particular lithographic apparatus in addition to different group fingerprints corresponding to each of the groups.

20. The method according to any preceding clause, wherein the metrology data comprises data measured over one or more previous lots, wherein a lot comprises one or more substrates, and the metrology data which is specific to at least one of the one or more previous lots does not comprise metrology data relating to one or more of the groups.

21. The method according to clause 20, wherein the groups comprise groups categorized and/or ranked according to correction need, and metrology for obtaining the metrology data is scheduled according to the categorization and/or ranking.

22. The method according to any preceding clause, comprising determining a confidence number based on complementary data, the confidence number indicative as to trustworthiness of one or more measurements.

23. The method according to clause 22, wherein the complementary data comprises one or more selected from: alignment data, leveling data, context data, maintenance action data, and/or other parameter data relating to a parameter other than that described by the metrology data, either from a present layer and/or an earlier layer, and/or parameter data relating to the parameter described by the metrology data from a previous layer.

24. The method according to any preceding clause, comprising learning a relationship between a metrology apparatus used to obtain the metrology data and one or more health indicators which are indicative of inaccuracy in a measurement, and using the one or more health indicators in determining a correction.

25. The method according to any preceding clause, wherein the metrology data comprises measurement data taken from multiple substrates, the multiple substrates having passed multiple different lithographic apparatuses, each of which imposes a different fingerprint on the substrate, and the common correction component at least in part relates to a common fingerprint component.

26. The method according to any preceding clause, wherein the metrology data comprises one or more selected from: overlay data, focus data and/or CD data.

27. A computer program comprising program instructions operable to perform the method of any preceding clause, when run on a suitable apparatus.

28. A non-transient computer program carrier comprising the computer program of clause 27.

29. A processing device operable to run the computer program of clause 27.

30. A lithographic apparatus operable to expose a pattern on a substrate, comprising the processing device of clause 29 and the lithographic apparatus is further operable to use the correction to correct an exposure on one or more subsequent substrates.

Any metrology data described herein may comprise post-processing data or performance data associated with one or more features provided to the substrates. Such performance data may, for example, relate to one or more selected from: overlay between layers, overlay between patterns applied by multiple patterning steps in a single layer, focus quality, CD of the one or more features, edge placement error of the one or more features, one or more electrical characteristics of the one or more features, and/or yield of the substrates relating to a relative amount of functioning devices comprising the one or more features.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. In that regard, the processed "substrates" may be semiconductor substrates, or they may be other substrates, according to the type of product being manufactured.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a substrate (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use of embodiments of the invention in the context of optical lithography, it will be appreciated that the invention, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a correction for an apparatus used in a process of patterning substrates, the method comprising:
   obtaining a group structure associated with a processing history and/or similarity in fingerprint of to be processed substrates;
   obtaining metrology data associated with a plurality of groups within the group structure, wherein the metrology data is correlated between the groups; and
   determining the correction for a group out of the plurality of groups by applying a model to the metrology data, the model comprising at least a group-specific correction component and a common correction component,
   wherein the model comprises one or more group-specific correction parameters and one or more common correction parameters, wherein the parameters are coefficients of base functions representing a spatial characteristic of the correction.

2. The method as claimed in claim 1, wherein the model further comprises an apparatus component.

3. The method as claimed in claim 1, wherein the determining the correction comprises performing an optimization which optimizes the one or more group-specific correction parameters and one or more common correction parameters with respect to the metrology data.

4. The method as claimed in claim 3, wherein the optimization comprises minimizing a cost function between the metrology data and a combination of base functions, wherein the one or more group-specific correction parameters and one or more common correction parameters serve as weighting factors of the base functions.

5. The method as claimed in claim 3, wherein the optimization comprises optimizing a probability that the one or more group-specific correction parameters and/or one or more common correction parameters are optimal with respect to the metrology data.

6. The method as claimed in claim 1, wherein the model is regularized to i) prefer one or more of the correction parameters close to previously determined one or more correction parameters and/or have a small absolute value, or ii) avoid degeneracy of a solution of the optimization.

7. The method as claimed in claim 1, wherein the determining the correction comprises application of a Weiner filter to the metrology data corresponding to a group other than the group for which the correction is being determined.

8. The method as claimed in claim 7, comprising training one or more Weiner filters, each Weiner filter corresponding to a particular pair of groups of the plurality of groups.

9. The method as claimed in claim 1, wherein the metrology data comprises data measured over one or more previous lots, wherein a lot comprises one or more substrates, and the metrology data which is specific to at least one of the one or more previous lots does not comprise metrology data relating to one or more of the groups.

10. The method as claimed in claim 9, wherein the groups comprise groups categorized and/or ranked according to correction need, and metrology for obtaining the metrology data is scheduled according to the categorization and/or ranking.

11. The method as claimed in claim 1, wherein the metrology data comprises measurement data taken from multiple substrates, the multiple substrates having passed multiple different lithographic apparatuses, each of which imposes a different fingerprint on the substrate, and the common correction component at least in part relates to a common fingerprint component.

12. The method as claimed in claim 1, wherein the metrology data comprises one or more selected from: overlay data, focus data and/or CD data.

13. A non-transient computer program carrier comprising instructions therein, the instructions, when executed by a computer system, configured to cause the computer system to at least:
   obtain a group structure associated with a processing history and/or similarity in fingerprint of to be processed substrates in a process of patterning substrates;
   obtain metrology data associated with a plurality of groups within the group structure, wherein the metrology data is correlated between the groups; and
   determine a correction a correction for an apparatus used in the process for a group out of the plurality of groups by applying a model to the metrology data, the model comprising at least a group-specific correction component and a common correction component,
   wherein the model comprises one or more group-specific correction parameters and one or more common correction parameters, wherein the parameters are coefficients of base functions representing a spatial characteristic of the correction.

14. The carrier of claim 13, wherein the instructions configured to cause the computer system to determine the correction are further configured to cause the computer system to perform an optimization which optimizes the one or more group-specific correction parameters and one or more common correction parameters with respect to the metrology data.

15. The carrier of claim 14, wherein the optimization comprises minimization of a cost function between the metrology data and a combination of base functions, wherein the one or more group-specific correction parameters and one or more common correction parameters serve as weighting factors of the base functions.

16. The carrier of claim 14, wherein the optimization comprises optimization of a probability that the one or more group-specific correction parameters and/or one or more common correction parameters are optimal with respect to the metrology data.

17. The carrier of claim 13, wherein the model is regularized to i) prefer one or more of the correction parameters close to previously determined one or more correction parameters and/or have a small absolute value, or ii) avoid degeneracy of a solution of the optimization.

18. The carrier of claim 13, wherein the instructions configured to cause the computer system to determine the correction are further configured to cause the computer system to apply a Weiner filter to the metrology data corresponding to a group other than the group for which the correction is being determined.

19. The carrier of claim 13, wherein the metrology data comprises data measured over one or more previous lots, wherein a lot comprises one or more substrates, and the metrology data which is specific to at least one of the one or more previous lots does not comprise metrology data relating to one or more of the groups.

20. The carrier of claim 13, wherein the metrology data comprises measurement data taken from multiple substrates, the multiple substrates having passed multiple different lithographic apparatuses, each of which imposes a different fingerprint on the substrate, and the common correction component at least in part relates to a common fingerprint component.

\* \* \* \* \*